United States Patent
Cotte et al.

(10) Patent No.: US 6,425,956 B1
(45) Date of Patent: Jul. 30, 2002

(54) PROCESS FOR REMOVING CHEMICAL MECHANICAL POLISHING RESIDUAL SLURRY

(75) Inventors: John Michael Cotte, New Fairfield, CT (US); Donald J. Delehanty, Wappingers Falls, NY (US); Kenneth John McCullough, Fishkill, NY (US); Wayne Martin Moreau, Wappinger, NY (US); John P. Simons, Wappingers Falls, NY (US); Charles J. Taft, Wappingers Falls, NY (US); Richard P. Volant, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/755,267

(22) Filed: Jan. 5, 2001

(51) Int. Cl.$^7$ ................................................. C23G 1/02
(52) U.S. Cl. ........................... 134/3; 134/2; 134/22.19; 134/36; 134/41; 134/42; 134/902; 438/690; 438/691; 438/692; 438/693
(58) Field of Search ............................ 134/2, 3, 36, 41, 134/42, 902, 22.19; 438/690, 691, 692, 693

(56) References Cited

U.S. PATENT DOCUMENTS

| | | | |
|---|---|---|---|
| 4,156,619 A | * 5/1979 | Griesshammer | 134/2 |
| 5,306,350 A | 4/1994 | Hoy et al. | 134/22.14 |
| 5,630,904 A | * 5/1997 | Aoyama et al. | 438/669 |
| 5,789,505 A | * 8/1998 | Wilkinson et al. | 526/209 |
| 5,800,625 A | * 9/1998 | Engelsberg et al. | 134/1 |
| 5,908,510 A | 6/1999 | McCullough et al. | 134/2 |
| 5,976,264 A | 11/1999 | McCullough et al. | 134/2 |
| 6,140,239 A | * 10/2000 | Avanzino et al. | 438/692 |
| 6,149,828 A | * 11/2000 | Vaartstra | 216/57 |
| 6,169,034 B1 | * 1/2001 | Avanzino et al. | 134/1.3 |
| 6,277,753 B1 | * 8/2001 | Mulle et al. | 438/692 |
| 6,277,799 B1 | * 8/2001 | Sachdev et al. | 510/176 |
| 2001/0008800 A1 | * 7/2001 | Koch | |

FOREIGN PATENT DOCUMENTS

| | | |
|---|---|---|
| EP | 0 572 913 | 12/1993 |
| EP | 0 726 099 | 8/1996 |
| JP | 08322848 | * 6/1998 |

\* cited by examiner

*Primary Examiner*—Sharidan Carrillo
(74) *Attorney, Agent, or Firm*—Scully, Scott, Murphy & Presser; Daniel P. Morris

(57) ABSTRACT

A process of removing residual slurry resulting from chemical mechanical polishing of a workpiece in which the workpiece is contacted with a composition of a supercritical fluid, said supercritical fluid including supercritical, carbon dioxide and a co-solvent, and a surfactant.

8 Claims, 2 Drawing Sheets

PROCESS FOR REMOVING CHEMICAL MECHANICAL POLISHING RESIDUAL SLURRY

BACKGROUND OF THE DISCLOSURE

1. Field of the Invention

The present invention is directed to a process for removing residual slurry after chemical mechanical polishing employing a supercritical fluid. More specifically, the present invention is directed to a process for removing residual slurry arising from planarizing of workpieces by utilizing composition of a supercritical fluid, which includes supercritical carbon dioxide and a co-solvent, and a surfactant.

2. Background of the Prior Art

A common and well established method of planarizing semiconductor wafers and other workpieces is by polishing surfaces to be planarized with a chemical mechanical polishing (CMP) slurry. Those skilled in the art are aware that these slurries are silica-based, tungsten-based, ceria-based or alumina-based and are used to remove silicon, metal coatings, silicon oxides and silicon nitrides and the like on silicon. As a result of this polishing, residual slurry, combined with the removed material, becomes deposited on all exposed areas of the workpiece.

In the past conventional brush and wet cleaning of residual CMP slurry was utilized. However, in view of the continuing decreased size of semiconductor devices, this brush and wet cleaning method, which utilizes water, has been less and less successful. This is so because water and other aqueous fluids employed in wet cleaning techniques have relatively high surface tensions. Water, for example, has a surface tension of about 70 dynes per square centimeter. This relatively high surface tension makes it very difficult or even impossible to dislodge and remove debris from vias, trenches and other nanostructures.

This difficulty is scientifically explained by the force of particle adhesion to a substrate surface. This adhesive force is dependent upon the adhesion between the debris particle and the surface. The major adhesive forces, which hold the debris to the surface, are Van der Waals and electrostatic forces. The semiconductor devices of the present day and even more so in the future have and will have substructures in the order of submicron dimensions. To remove residual CMP slurry particles left after chemical mechanical polishing, requires a low surface tension fluid that is able to penetrate into a depression and into the interface between a debris particle and the surface in which the particle is entrapped inside a submicron depression. Thus, it is apparent that a totally new process must be devised to ensure that debris particles, resulting from chemical mechanical polishing, are removed.

Recent developments have focused on removal of residues from semiconductor surfaces, albeit not necessarily CMP slurry residues. U.S. Pat. Nos. 5,908,510 and 5,976,264 involve the removal of residue from an etched precision surface utilizing supercritical fluids or liquid carbon dioxide. More specifically, the residue removed from etched precision surfaces in these disclosures are fluorine- or chlorine-containing residues. These disclosures also indicate that a cryogenic aerosol, which may be argon, nitrogen or carbon dioxide, may be employed as a subsequent step after processing with a supercritical fluid or liquid carbon dioxide.

U.S. Pat. No. 5,306,350 describes a method of cleaning apparatus by removing one or more polymeric compounds therefrom. This is accomplished by a cleaning composition which includes at least one compressed fluid, which is a gas at standard conditions, and a solvent. The at least one or more removed polymeric compounds are at least partially soluble in the solvent and at least partially miscible with the compressed fluid. This compressed fluid may be supercritical carbon dioxide, nitrous oxide or a mixture thereof. This method is preferably accomplished by spraying.

European Patent Application 0 572 913 describes a system of continuously processing items using a supercritical fluid in which the items to be cleaned or extracted are continuously pressurized with the supercritical fluid.

European Patent Application 0 726 099 is directed to a process of removing surface contaminants from a substrate by contacting the substrate with a dense phase gas at or above the critical pressure thereof. A preferred dense phase gas is carbon dioxide.

Although the aforementioned references represent advances in the art, none of them address the specific problem of removing chemical mechanical polishing slurry residue from semiconductor surfaces and nanostructures. Thus, there is a continuing need in the art for a new process to address this important problem.

SUMMARY OF THE INVENTION

A new process has now been developed for removal of residual chemical mechanical polishing (CMP) slurry from topographical structures on semiconductor wafers. This residual CMP slurry removal eliminates problems in subsequent processing operations which lead to contamination, electrical device opens, electrical device shorts and other yield/reliability concerns.

Although the invention is not limited to any theory explaining its operation, it is believed that two requirements must be met in order to overcome the difficulties discussed above. First, a residual slurry removal fluid must be utilized which has a low enough surface tension to permit the fluid to penetrate into very narrow openings. Secondly, the fluid must be able to neutralize any charge on the slurry particles to allow the fluid to not only penetrate into the narrow openings but also dislodge the residual slurry particles. The invention of the present application provides a cleaning fluid which meets these physical requirements.

In accordance with the present invention a process is provided for removal of residual slurry resulting from chemical mechanical processing which comprises removing residual slurry resulting from chemical mechanical polishing with a composition which comprises a mixture of a supercritical fluid, wherein the supercritical fluid comprises carbon dioxide and a co-solvent and a surfactant.

BRIEF DESCRIPTION OF THE DRAWINGS

The present invention will be better understood by reference to the accompanying drawings of which.

DETAILED DESCRIPTION OF THE INVENTION

The process of the present invention involves removal of residual slurry after chemical mechanical polishing (CMP)

that remain on semiconductor wafers. Insofar as CMP is utilized to planarize surfaces on semiconductor wafers, it is apparent that the residual material removed therefrom is primarily the CMP slurry, which is silica-based, tungsten-based, ceria-based or alumina-based, and wafer debris. In addition, since the debris includes material removed from a semiconductor wafer, the residual material may include, in addition to Si and $SiO_2$, any one or more of several metals such as Al, W, Ti, Ta, Pt, Pd, Ir, Cr, Cu and Ag. In addition, polymers, such as polyimides and polyamides, may also be present in the residual material removed in the process of the present invention.

Figure 1:
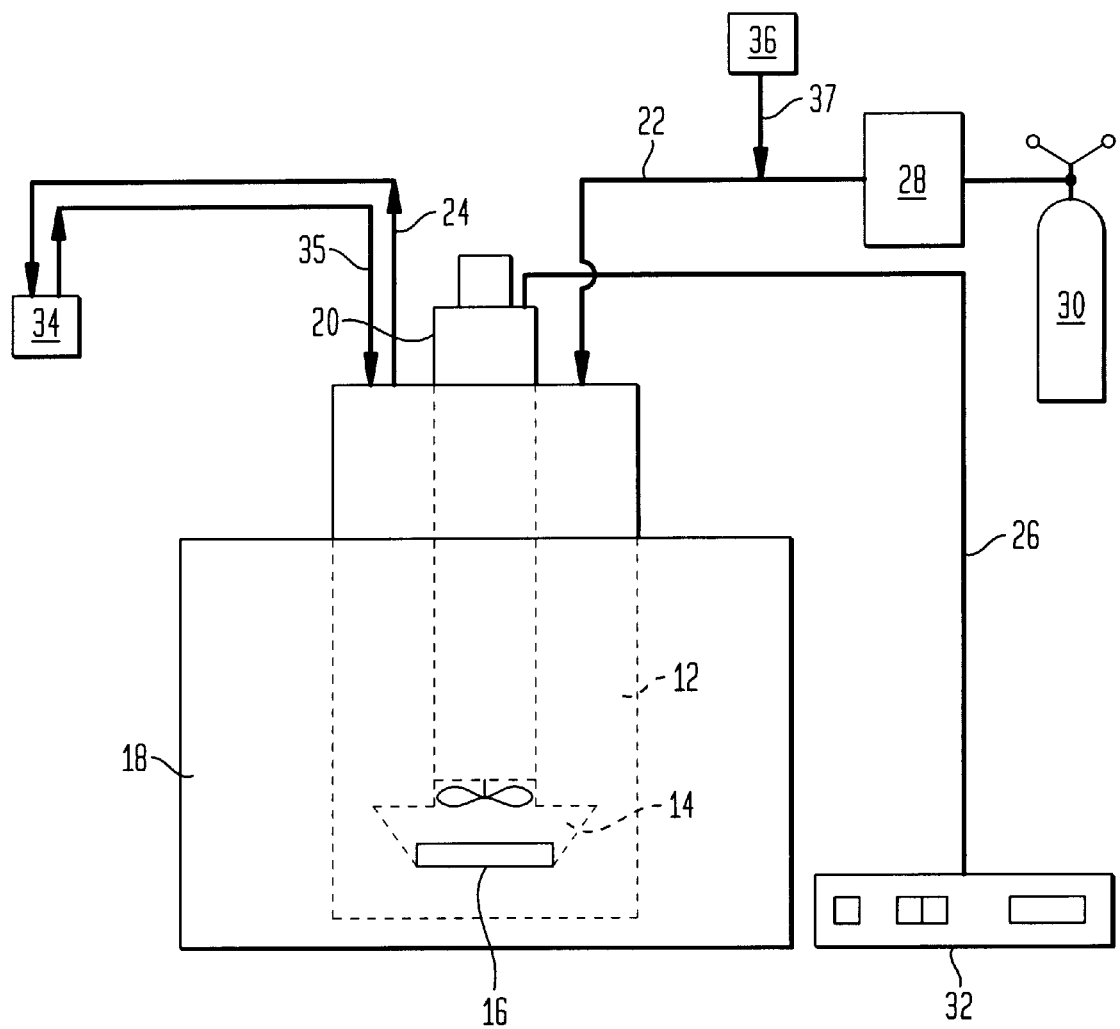
FIG. 1 is a schematic diagram of the apparatus employed in the present invention for the removal of residual slurry from a semiconductor wafer after chemical mechanical polishing.
Figure 2:
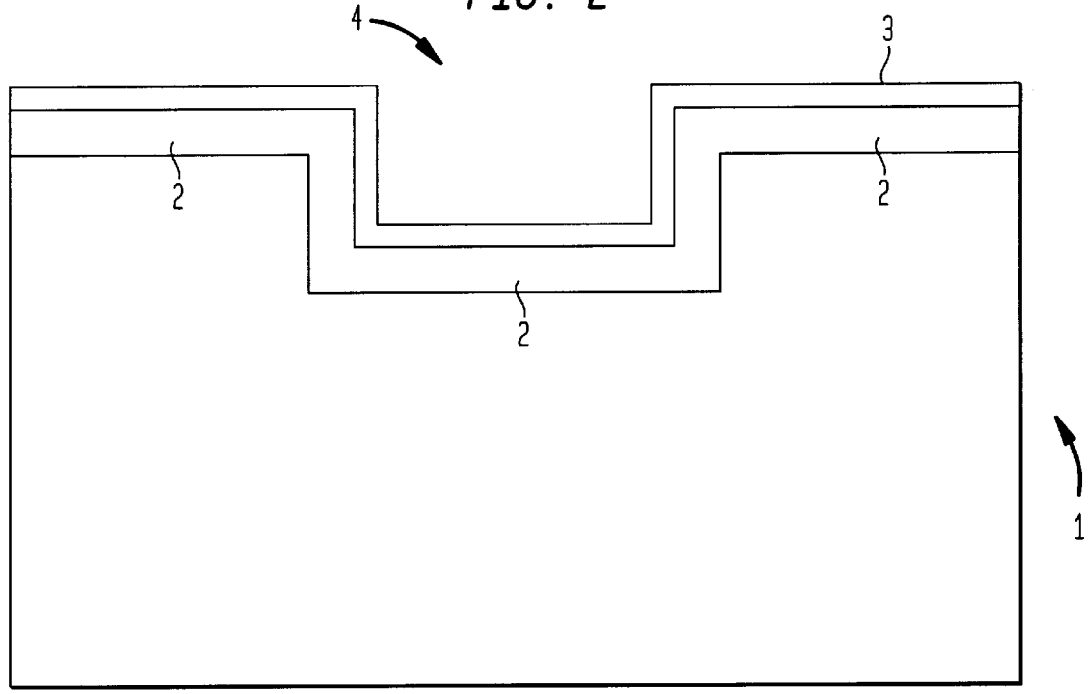
FIG. 2 illustrates a typical semiconductor wafer prior to chemical mechanical polishing.
Figure 3:
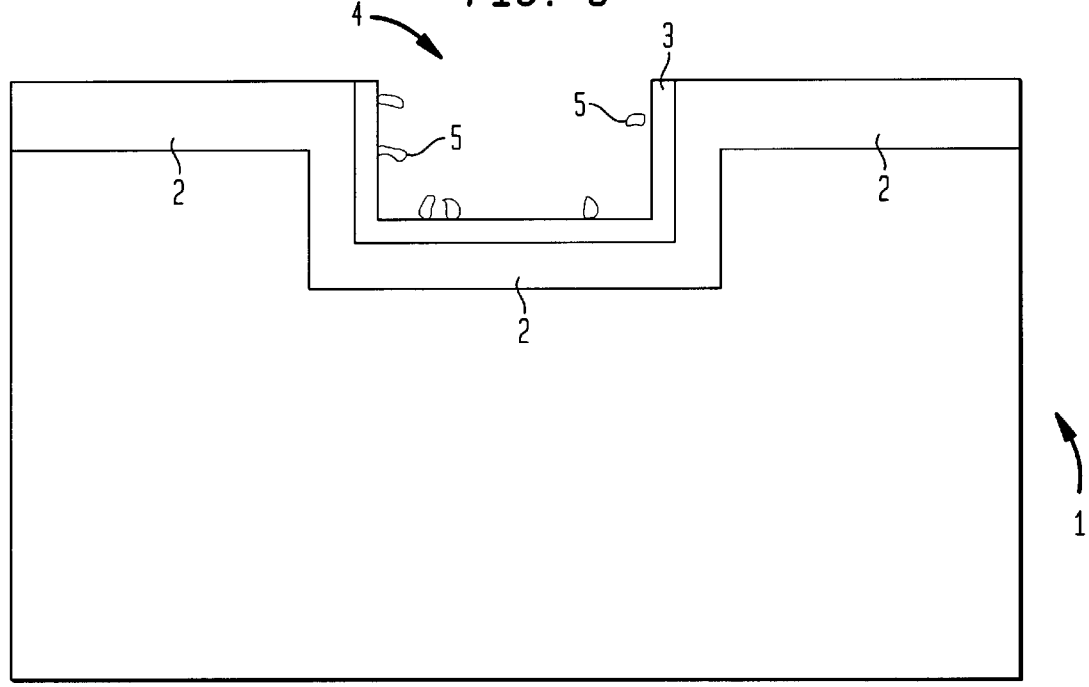
FIG. 3 illustrates the semiconductor wafer after chemical mechanical polishing demonstrating residual CMP slurry debris.

The process of the present invention may be conducted in an apparatus 10 as depicted in the FIG. 1. Apparatus 10 includes a process chamber 12 having a sample zone 14 wherein a workpiece, denoted by reference numeral 16, is disposed. The workpiece 16 may be a silicon wafer, a microelectrical machine or other semiconductor device. The process chamber 12 is surrounded by a heater jacket 18 and may include a stirring mechanism 20. Additionally, the process chamber contains an inlet line 22, an outduct 24 and a thermocouple 26. The inlet line 22 contains a high pressure pump system 28 which is in communication with a gas cylinder 30 for supplying a supercritical fluid or mixture thereof to the process chamber 12. Thermocouple 26 is also connected to a heater control 32 which is utilized for controlling and monitoring the temperature in the process chamber 12. Apparatus 10 may also include a reservoir 34 for collecting and/or purifying supercritical fluids that exit process chamber 12 through outduct 24. This material may then be recycled into the process chamber through duct 35.

The term "supercritical" fluid refers to the fact that the fluid is above its critical point, i.e., critical temperature, $T_c$, and critical pressure, $P_c$, at which the two fluid phases of a substance, in equilibrium with each other, become identical, forming one phase. The supercritical fluid comprises supercritical carbon dioxide and a co-solvent.

The co-solvent may be (a) a compound having the structural formula $HOOC—(CH_2)_n—COOH$, where n is 0, 1 or 2; a compound having the structural formula $RSO_3H$, where R is hydrogen, methyl, ethyl or $CF_3$; (c) a compound having the structural formula $R^1COOH$, where $R^1$ is hydrogen, $CF_3$, $C_2F_5$, methyl, ethyl or propyl; (d) methanol; (e) triethanolamine; (f) N-methyl pyrrolidine and (g) mixtures thereof.

Of the co-solvents within the contemplation of the present invention those within the scope of components (a), (b) and (c), the three classes of acid compounds, and mixtures thereof, are preferred. Amongst these acids, oxalic acid, formic acid, acetic acid and perfluoroacetic acid are particularly preferred for employment as the co-solvent.

The supercritical fluid, which comprises supercritical carbon dioxide and the co-solvent, is preferably present such that the co-solvent represents less than about 20% of the total volume of the supercritical fluid. More preferably, the supercritical fluid comprises between about 1% and about 10% co-solvent and the remainder supercritical carbon dioxide, based on the total volume of the supercritical fluid.

The purity of the supercritical fluid is not critical to the practice of the present invention. If a low purity supercritical fluid is employed, the supercritical fluid can be first purified to remove the impurities using techniques well known to those skilled in the art. For instance, a low purity supercritical fluid could be purified by passing it through a purification column prior to entering the processing chamber.

It is also emphasized that the supercritical fluid is combined with a surfactant to form a composition for removing CMP slurry residue from the semiconductor wafer. The surfactant forms a homogeneous mixture with the supercritical fluid under the thermodynamic conditions extant in the process chamber 12. The surfactant may be introduced into the chamber 12 prior to the introduction of the supercritical fluid. In an alternate embodiment, a surfactant disposed in reservoir 36 is in communication with a conduit 37, which is also in communication with conduit 22, is separately introduced into the process chamber 12 concurrent with the introduction of the supercritical fluid therein.

Any surfactant effective in removing residual slurry particles following CMP may be utilized in the present invention. Of the surfactants that may be utilized in the homogeneous mixture of supercritical fluid and surfactant to remove CMP residual slurry, anionic surfactants are preferred. Among the anionic surfactants particularly preferred for utilization in the present invention are ammonium carboxylates and ammonium sulfonates. A particularly preferred example of an ammonium sulfonate, preferred for use in the present invention, is ammonium perfluoroalkylsulfonate. A particularly preferred example of an ammonium carboxylate is ammonium perfluoroethercarboxylate.

As shown in FIG. 1, the supercritical fluid may be pre-pressurized by a high pressure pump 28. Typically, the supercritical fluid is pre-pressurized to a pressure in the range of between about 1000 psi to about 6000 psi. More preferably, the supercritical fluid is pre-pressurized to a pressure of about 3000 psi before entering the processing chamber. The pre-pressurized supercritical fluid is then transferred to the processing chamber 12 through inlet line 22.

The semiconductor wafer or sample, illustrative of a typical workpiece 16, employed in the present invention is any semiconductor sample that is subjected to CMP. Illustrated examples of suitable semiconductor samples that may be used in the present invention include, but are not limited to, semiconductor wafers, semiconductor chips, ceramic substrates, patterned film structures and the like. For example, the workpiece 16 may include one or more of the following materials: titanium silicide, tantalum nitride, tantalum silicide, silicon, polysilicon, silicon nitride, $SiO_2$, diamond-like carbon, polyimide, polyamide, aluminum, aluminum with copper, copper, tungsten, titanium, palladium, platinum, iridium, chromium, ferroelectric materials and high dielectric materials such as BaSrTi or PbLaTi oxides.

In practice, a semiconductor wafer or other workpiece 16 containing CMP slurry residue is placed in sample zone 16 of process chamber 12 wherein the sample is exposed to the composition of supercritical fluid and surfactant under conditions which are sufficient to remove the CMP slurry residue from the sample while maintaining the supercritical fluid above its critical temperature and pressure. Typically, the pressure within process chamber 12, during CMP slurry residue removal, is in the range of from about 1000 psi to about 6000 psi. More preferably, the pressure within the process chamber is about 3000 psi. The temperature within the process chamber 12, during CMP slurry residue removal, is in the range of between about 40° C. to about 100° C. More preferably, the temperature within the process chamber during CMP slurry residue removal is about 70° C.

It is emphasized that temperature conditions in process chamber 12 are controlled by heat controller 32 which has the capability to monitor the temperature in chamber 12 by means of thermocouple 26. The measured temperature is adjusted by heat jacket 18, controlled by controller 32, in accordance with temperature control means well known in the art.

To ensure effective removal of the CMP slurry residue from the semiconductor sample, the semiconductor sample is exposed to the supercritical fluid under the above conditions for about 2 minutes to about 30 minutes. More preferably, the time period of exposure of the workpiece 16 to the supercritical fluid under the above-identified conditions is about 2 minutes.

The supercritical fluid exiting the process chamber through outduct 24 may be cleaned, as described above, and recycled back into the apparatus. In this manner a closed reactor system is formed. Such a closed reactor system is illustrated in FIG. 1. Such an apparatus may or may not be provided in the process of the present invention. Obviously, a closed reactor system reduces processing costs at the price of increased capital expense. In the preferred embodiment illustrated in FIG. 1, where such a system is employed, the exhaust supercritical fluid enters a reservoir 34 through conduit 24 and is recycled back into chamber 12 through conduit 35.

Apparatus 10 is shown provided with a stirring mechanism. In this preferred embodiment, depicted generally at 20, the speed of the stirring unit varies from about 100 rpm to about 1000 rpm. More preferably, stirring occurs at about 500 rpm.

To better appreciate the process of the present invention, attention is directed to a typical semiconductor wafer that is subjected to chemical mechanical polishing. Typically, a semiconductor wafer 1 is provided with the first film layer 2 and a second top film layer 3. These film layers may cover the horizontal surface as well as the surface of a trench or via 4. In order to remove the layer 3 from the horizontal surface without disturbing the layer 3 in the via 4, chemical mechanical polishing of the top surface occurs. However, this chemical mechanical polishing, which successfully removes layer 3 from the top surface of wafer 1, leaves CMP slurry residue 5 in via 4. It is this residue that is removed in apparatus 10.

The above description and embodiments will make apparent, to those skilled in the art, other embodiments and examples. These other embodiments and examples are within the contemplation of the present invention. Therefore, the present invention should be limited only by the appended claims.

What is claimed is:

1. A process of removing residual slurry resulting from chemical mechanical polishing of a semiconductor wafer which comprises removing residual slurry from a semiconductor wafer, after chemical mechanical polishing, with a composition which comprises a mixture of a supercritical fluid and a surfactant selected from the group consisting of an ammonium carboxylate and an ammonium sulfonate.

2. A process in accordance with claim 1 wherein said supercritical fluid comprises supercritical carbon dioxide and said composition further includes a co-solvent selected from the group consisting of:
    (a) a compound having the structural formula HOOC—$(CH_2)_n$—COOH, where n is 0, 1 or 2;
    (b) a compound having the structural formula $RSO_3H$, where R is hydrogen, methyl, ethyl or $CF_3$;
    (c) a compound having the structural formula $R^1COOH$, where $R^1$ is $CF_3$, $C_2F_5$, hydrogen, methyl, ethyl or propyl;
    (d) triethanolamine;
    (e) methanol;
    (f) N-methyl pyrrolidone; and
    (g) mixtures thereof.

3. A process in accordance with claim 1 wherein said surfactant is an ammonium carboxylate.

4. A process in accordance with claim 1 wherein said surfactant is an ammonium sulfonate.

5. A process in accordance with claim 2 wherein said co-solvent is selected from the group consisting of (a), (b), (c) and (g).

6. A process in accordance with claim 3 wherein said ammonium carboxylate is ammonium perfluoroethercarboxylate.

7. A process in accordance with claim 4 wherein said ammonium sulfonate is ammonium perfluoroalkylsulfonate.

8. A process in accordance with claim 5 wherein said co-solvent is selected from the group consisting of oxalic acid, formic acid, acetic acid and perfluoroacetic acid.

* * * * *